United States Patent
Lee et al.

(10) Patent No.: US 11,011,405 B2
(45) Date of Patent: May 18, 2021

(54) APPARATUS FOR SUPPORTING SUBSTRATE HAVING GAS SUPPLY HOLE AND METHOD OF MANUFACTURING SAME

(71) Applicant: SEMES CO., LTD., Cheonan-si (KR)

(72) Inventors: Sang Kee Lee, Cheonan-si (KR); Jae Kyung Lee, Cheonan-si (KR)

(73) Assignee: SEMES CO., LTD.

( * ) Notice: Subject to any disclaimer, the term of this patent is extended or adjusted under 35 U.S.C. 154(b) by 10 days.

(21) Appl. No.: 16/599,155

(22) Filed: Oct. 11, 2019

(65) Prior Publication Data
US 2020/0118860 A1  Apr. 16, 2020

(30) Foreign Application Priority Data
Oct. 15, 2018 (KR) .................. 10-2018-0122794

(51) Int. Cl.
*H01T 23/00* (2006.01)
*H01L 21/683* (2006.01)

(52) U.S. Cl.
CPC ............................... *H01L 21/6833* (2013.01)

(58) Field of Classification Search
None
See application file for complete search history.

(56) References Cited

U.S. PATENT DOCUMENTS

| 2009/0168292 A1 | 7/2009 | Watanabe et al. |
| 2009/0200523 A1* | 8/2009 | Kobayashi ............ C04B 35/505 252/516 |
| 2013/0285336 A1* | 10/2013 | Ito ........................... H01B 1/08 279/128 |
| 2013/0308244 A1 | 11/2013 | Shiraiwa et al. |
| 2016/0352260 A1* | 12/2016 | Comendant ......... H01L 21/6831 |

FOREIGN PATENT DOCUMENTS

| JP | 2010-34256 A | 2/2010 |
| KR | 10-2009-0071489 | 7/2009 |
| KR | 10-2013-0129842 | 11/2013 |
| KR | 10-2017-0025964 | 8/2017 |

* cited by examiner

Primary Examiner — Stephen W Jackson

(57) ABSTRACT

An apparatus for supporting a substrate is proposed. The apparatus includes: a base plate including at least one first gas supply hole formed therein so as to allow supply of a temperature control gas; and an electrostatic chuck provided on the base plate to support the substrate, and including at least one second gas supply hole formed therein so as to be in communication with the at least one first gas supply hole, wherein the at least one second gas supply hole is formed before sintering of the electrostatic chuck.

13 Claims, 7 Drawing Sheets

ID=1,2" -->

APPARATUS FOR SUPPORTING SUBSTRATE HAVING GAS SUPPLY HOLE AND METHOD OF MANUFACTURING SAME

CROSS REFERENCE TO RELATED APPLICATION

The present application claims priority to Korean Patent Application No. 10-2018-0122794, filed Oct. 15, 2018, the entire contents of which is incorporated herein for all purposes by this reference.

BACKGROUND OF THE INVENTION

Field of the Invention

The present invention relates to an apparatus for supporting a substrate, the apparatus being used during processing of a semiconductor substrate such as a wafer, and a method of manufacturing the same.

Description of the Related Art

Recently, plasma processing equipment has been widely used to produce thin film deposition and etching on a semiconductor substrate in the process of fabricating a semiconductor device.

One example of plasma processing equipment includes a processing chamber having a space for processing a semiconductor substrate, and a substrate support apparatus disposed inside the processing chamber to support the semiconductor substrate.

One example of the substrate support apparatus includes a base plate made of aluminum, a ceramic electrostatic chuck disposed on the upper side of the base plate, and an internal electrode provided inside the ceramic electrostatic chuck. A power source for generating an electrostatic force is connected to the electrode. A semiconductor substrate is adsorbed and held on the chuck by the electrostatic force.

The semiconductor substrate held on the chuck is heated by plasma gas, and a cooling gas for controlling the temperature of the semiconductor substrate is supplied to the backside of the semiconductor substrate. One example of an inert gas mainly used as the cooling gas is helium (He) gas. The cooling gas is supplied to the backside of the semiconductor substrate through cooling gas supply holes formed in the base plate and the electrostatic chuck.

On the other hand, with the trend toward miniaturization in semiconductor industry, higher RF power is required for plasma generation. This may lead to a serious problem of electrical discharge in the cooling gas supply holes. Such electrical discharge may cause damage to the substrate support apparatus.

In order to suppress occurrence of electrical discharge, technology development is being pursued to minimize a space where electrical discharge may occur, such as reducing the diameter of the cooling gas supply holes or inserting porous ceramics. However, due to limitations of machining, there is a limit to reducing the diameter of the holes below a predetermined diameter (e.g., 0.1 mm). In addition, sufficient insulation breakdown voltage may not be obtained only by providing a porous body of ceramic in a gas introduction passage.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) Korean Patent Application Publication No. 10-2017-0025964

SUMMARY OF THE INVENTION

Accordingly, the present invention has been made keeping in mind the above problems occurring in the related art, and an objective of the present invention is to provide an apparatus for supporting a substrate and a method of manufacturing the same, whereby occurrence of electrical discharge in a gas supply hole is minimized.

An objective of the present invention is not limited to the above objective, and other objectives and advantages of the present invention which are not mentioned may be understood by the following description.

In order to achieve the above objective, according to one aspect of the present invention, there is provided an apparatus for supporting a substrate, the apparatus including: a base plate including at least one first gas supply hole formed therein so as to allow supply of a temperature control gas; and an electrostatic chuck provided on the base plate to support the substrate, and including at least one second gas supply hole formed therein so as to be in communication with the at least one first gas supply hole, wherein the at least one second gas supply hole is formed before sintering of the electrostatic chuck.

In an embodiment of the present invention, the at least one second gas supply hole may be smaller in diameter than the at least one first gas supply hole.

In an embodiment of the present invention, the second gas supply holes may be grouped into a plurality of groups of second gas supply holes, such that one group of the plurality of groups of second gas supply holes may be disposed within a diameter range of one of the at least one first gas supply hole.

In an embodiment of the present invention, the second gas supply holes may be arranged at irregular intervals.

In an embodiment of the present invention, the base plate and the electrostatic chuck may be bonded together by an adhesive layer.

In an embodiment of the present invention, the apparatus may further include a porous body provided inside the at least one first gas supply hole.

According to another aspect of the present invention, there is provided a method of manufacturing an apparatus for supporting a substrate, the method including: forming a first gas supply hole in a base plate; forming a second gas supply hole in an electrostatic chuck; sintering the electrostatic chuck so as to reduce a diameter of the second gas supply hole; and fixing the sintered electrostatic chuck onto the base plate such that the first and second gas supply holes communicate with each other.

In an embodiment of the present invention, in the forming of the second gas supply hole in the electrostatic chuck, a plurality of second gas supply holes may be formed to be disposed within a diameter range of the first gas supply hole.

In an embodiment of the present invention, the method may further include supplying a fluid into the second gas supply hole at a predetermined pressure after the sintering of the electrostatic chuck.

According to the exemplary embodiments of the present invention, forming of a gas supply hole is performed before sintering of a ceramic electrostatic chuck so as to allow the gas supply hole to be contracted during sintering of the ceramic electrostatic chuck, thus realizing a gas supply hole having a minimized diameter. This therefore provides an effect of minimizing occurrence of electrical discharge in the gas supply hole.

An effect of the present invention is not limited to the above effect, and it should be understood that the effect of the present invention include all effects that can be inferred from the configuration of the invention described in the detailed description of the invention or the appended claims.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

Figure 1:
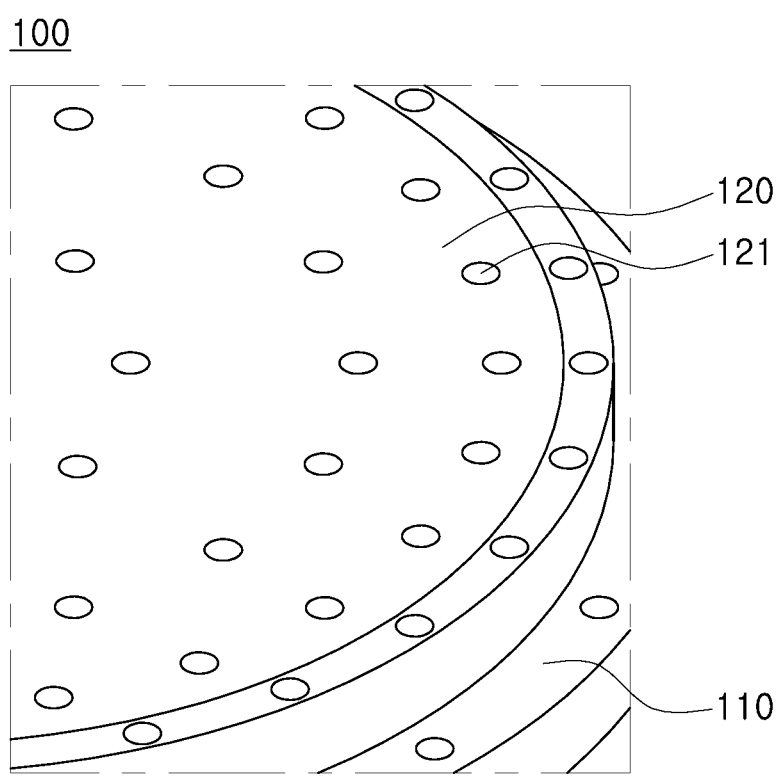
FIG. 1 is a plan view showing an apparatus for supporting a substrate according to a first embodiment of the present invention.

Hereinbelow, exemplary embodiments of the present invention will be described in detail with reference to the accompanying drawings. It should be understood that the embodiments may be changed to a variety of embodiments and the scope and spirit of the invention are not limited to the embodiments described hereinbelow.

In the following description, it is to be noted that, when the functions of conventional elements and the detailed description of elements related with the present invention may make the gist of the present invention unclear, a detailed description of those elements will be omitted. Wherever possible, the same reference numerals will be used throughout the drawings and the description to refer to the same or like elements or parts.

It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. The terminology used herein is for the purpose of describing particular embodiments only and is not intended to be limiting. Unless otherwise defined, all terms including technical and scientific terms used herein have the same meaning as commonly understood by one of ordinary skill in the art to which this invention belongs.

Figure 2:
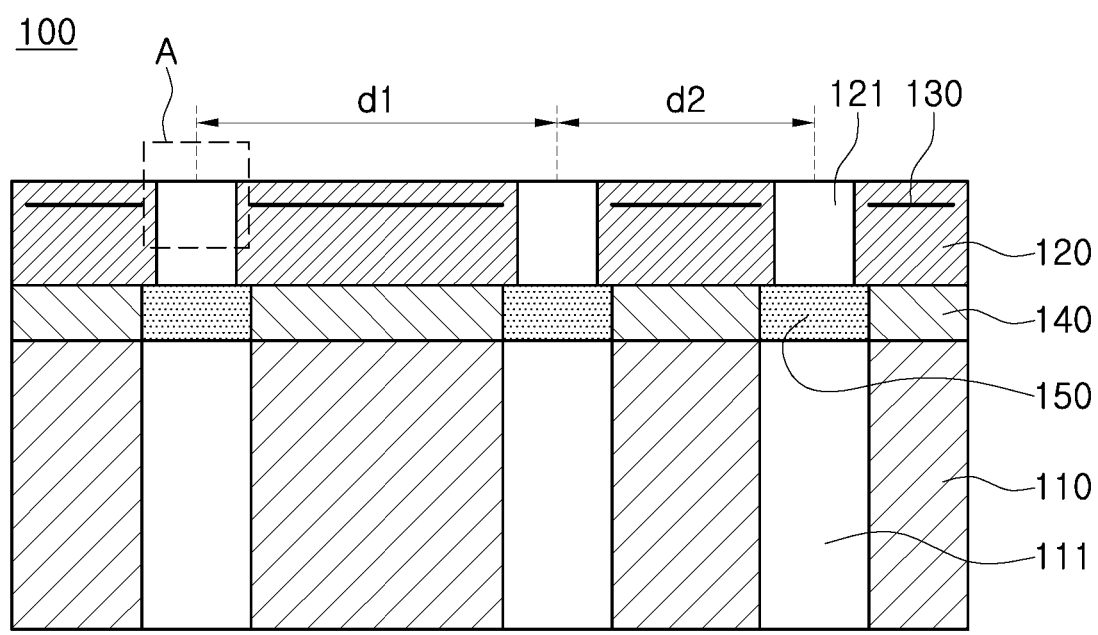
FIG. 2 is a sectional view showing the apparatus for supporting the substrate according to the first embodiment of the present invention.

FIGS. 1 and 2 show an apparatus for supporting a substrate according to a first embodiment of the present invention.

Referring to FIGS. 1 and 2, an apparatus for supporting a substrate according to an embodiment includes a base plate 110, and a ceramic electrostatic chuck 120.

The base plate 110 supports the ceramic electrostatic chuck 120. The base plate 110 has an upper surface and a lower surface, and the ceramic electrostatic chuck 120 is disposed on the upper surface of the base plate 110. The base plate 110 may be made of a metal material, for example, aluminum.

The base plate 110 includes at least one first gas supply hole 111 formed therein. The at least one first gas supply hole 111 is formed to penetrate the upper and lower surfaces of the base plate 110.

This configuration allows the base plate 110 to serve to control the temperature of the electrostatic chuck 120. For example, when the electrostatic chuck 120 is needed to be cooled, a cooling medium may be introduced through the at least one first gas supply hole 111 of the base plate 110 to cool the electrostatic chuck 120 adsorbed on the base plate 110. On the contrary, when the electrostatic chuck 120 is needed to be thermally insulated, a thermal insulating medium may be inserted into the at least one first gas supply hole 111. Alternatively, a heating element may be embodied in the electrostatic chuck 120 or the base plate 110. When the temperature of the electrostatic chuck 120 is controlled by the base plate 110 as described above, it is ensured that the temperature of an object to be adsorbed and held on the electrostatic chuck 120, that is, a substrate, is controlled.

The electrostatic chuck 120 is provided on the upper surface of the base plate 110. The electrostatic chuck 120 is fixed onto the base plate 110 by an adhesive layer 140 interposed therebetween. One example of the adhesive layer 140 may be a silicone adhesive.

An electrode 130 is provided inside the electrostatic chuck 120. When a voltage for electrostatically adsorbing and holding the substrate is applied to the electrode 130, the electrostatic chuck 120 adsorbs and holds the substrate by use of an electrostatic force.

The electrostatic chuck 120 includes at least one second gas supply hole 121 formed therein. The at least one second gas supply hole 121 is formed before sintering of the electrostatic chuck 120. During sintering of the electrostatic chuck 120, the diameter of the at least one second gas supply hole 121 may be reduced. Therefore, it is preferable that how much the diameter of the at least one second gas supply hole 121 is reduced is ascertained during sintering of the electrostatic chuck 120, and that the electrode 130 includes a hole having a diameter larger than that of the at least one second gas supply hole 121 to avoid interference with the at least one second gas supply hole 121.

The at least one second gas supply hole 121 is in communication with the at least one first gas supply hole 111. Due to the fact that the diameter of the at least one second gas supply hole 121 is reduced during sintering of the electrostatic chuck 120, the diameter of the at least one second gas supply hole 121 may be smaller than that of the at least one first gas supply hole 111. Furthermore, the second gas supply holes 121 may have different diameters.

On the other hand, as shown in FIG. 2, after sintering of the electrostatic chuck 120, the second gas supply holes 121 may be arranged at irregular intervals. For example, when the interval between one of the second gas supply holes and a neighboring second gas supply hole is d1, and the interval between a remaining one of the second gas supply holes and the neighboring second gas supply hole is d2, the intervals d1 and d2 may be different from each other.

The ceramic electrostatic chuck 120, which includes the electrode 130 provided therein and is manufactured by sintering as described above, electrostatically adsorbs a substrate such as a silicon wafer by use of an electrostatic force in response to application of electric power for electrostatic adsorption to the electrode 130 provided therein.

When a cooling gas such as helium (He) gas is supplied to the at least one first gas supply hole 111, with the substrate adsorbed and held on the chuck, the cooling gas is transferred to the backside of the substrate adsorbed and held on the electrostatic chuck 120 through the at least one second gas supply hole 121 being in communication with the at least one first gas supply hole 111, whereby the substrate is directly cooled by the transferred cooling gas.

Figure 3:
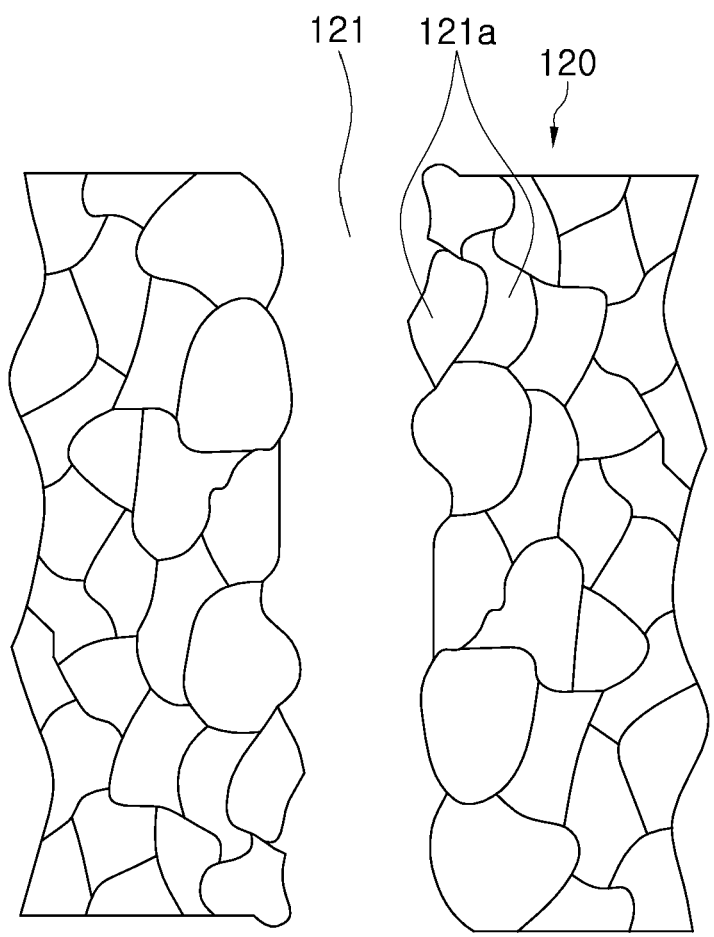
FIG. 3 is an enlarged view showing portion "A" of FIG. 2 in detail.
Figure 4:
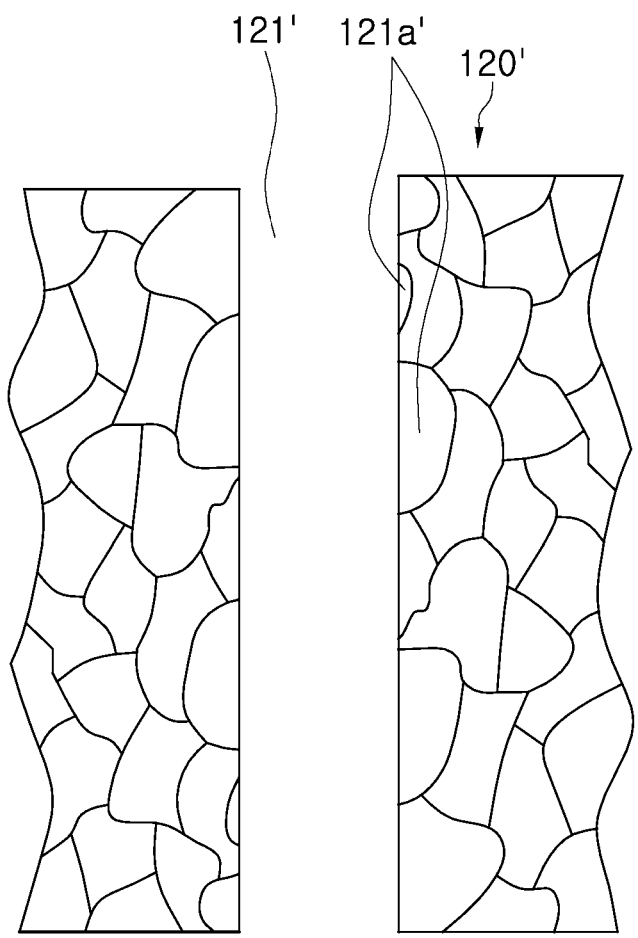
FIG. 4 is a view showing a comparative example with respect to FIG. 3.

As in the present embodiment, when the at least one second gas supply hole 121 is formed before sintering of the electrostatic chuck 120 and then sintering of the electrostatic chuck 120 is performed, as shown in FIG. 3, it is ensured that an inner wall of the at least one second gas supply hole 121 has a stable hole structure in which crystal grains 121a are not damaged. However, in a comparative example, as shown in FIG. 4, when a second gas supply hole 121' is formed by a method such as a perforating technique after sintering of the electrostatic chuck 120, an inner wall of the second gas supply hole 121' may have a structure in which crystal grains 121a' are damaged. This may cause particles to be generated from the damaged crystal grains 121a' during a process.

Figure 5:
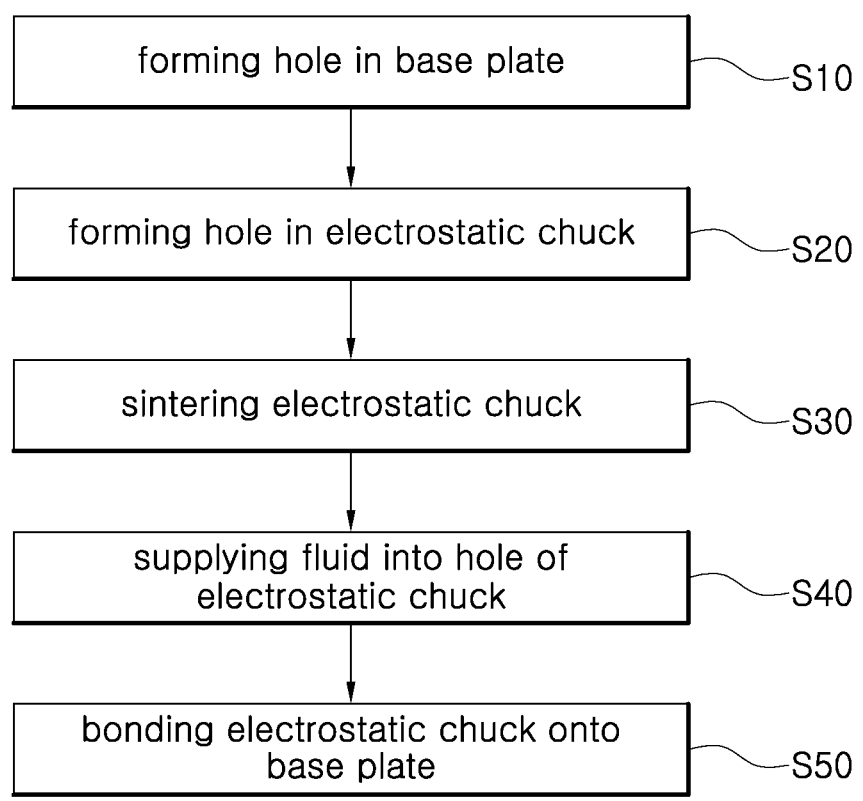
FIG. 5 is a flowchart showing a manufacturing process of the apparatus for supporting the substrate according to the first embodiment of the present invention.

FIG. 5 is a flowchart showing a method of manufacturing the apparatus for supporting the substrate according to the first embodiment of the present invention.

Referring to FIG. 5, a sintered ceramic electrostatic chuck is bonded and fixed onto a metal base plate, thus manufacturing an apparatus for supporting a substrate.

In such an electrostatic chuck, an inert gas such as helium (He) gas is allowed to flow between the surface of the electrostatic chuck and the backside of a substrate as an object to be adsorbed on the chuck, thus controlling the temperature of the substrate as an object to be adsorbed on the chuck.

For example, in a substrate processing device such as a chemical vapor deposition (CVD) device, a sputtering device, an ion implantation device, an etching device, and the like, a temperature rise of a substrate may be involved during processing. In such a substrate processing device, in order to suppress the temperature rise of the substrate, there is employed a method in which an inert gas, such as helium (He) gas, is allowed to flow between an electrostatic chuck and the substrate which is an object to be adsorbed on the chuck, so as to be brought into contact with the substrate.

To this end, in the substrate processing device for controlling the temperature of the substrate by use of an inert gas such as helium (He) gas, gas supply holes for introduction of an inert gas such as helium (He) gas are formed in the electrostatic chuck and a base plate supporting the electrostatic chuck.

That is, in the method of manufacturing the apparatus for supporting the substrate, a first gas supply hole is formed in the base plate (S10). Correspondingly, a second gas supply hole is formed in the electrostatic chuck (S20). A porous body of ceramic may be provided inside the first gas supply hole to increase insulation in the first gas supply hole.

The second gas supply hole is formed before sintering of the electrostatic chuck. When the electrostatic chuck is sintered (S30), the diameter of the second gas supply hole is reduced. As a result, it is ensured that the diameter of the second gas supply hole is sufficiently reduced to a desired value after sintering of the electrostatic chuck is completed. In the related art, a second gas supply hole is typically formed by use of a perforating method or laser after sintering of an electrostatic chuck, which has a limit to reduce the diameter of the second gas supply hole to a predetermined diameter, for example, equal to or less than 0.1 mm. This limits reduction in occurrence of electrical discharge in the second gas supply hole. However, according to the exemplary embodiment of the present invention, since forming of the second gas supply hole is performed before sintering of the electrostatic chuck, it is ensured that the diameter of the second gas supply hole is sufficiently reduced to a desired value.

As such, the present invention can realize formation of a micro-hole. This therefore provides an advantage in that when a process is performed using the electrostatic chuck manufactured by the method described above, occurrence of electrical discharge in the second gas supply hole is minimized.

On the other hand, a plurality of second gas supply holes may be formed before sintering of the electrostatic chuck, and then the sintering of the electrostatic chuck may be performed. In this case, the interval between second gas supply holes may become irregular depending on the shrinkage rate of the chuck. Therefore, when the second gas supply holes are formed before sintering of the electrostatic chuck, it may be necessary to accurately form the second gas supply holes at locations corresponding to predetermined locations which are predetermined in consideration of the shrinkage rate of the chuck.

Furthermore, when the second gas supply hole is formed before sintering, clogging of the second gas supply hole may occur due to shrinkage of the chuck during sintering. In particular, in the case of forming a micro-hole having a diameter of equal to or less than 0.1 mm, clogging of the second gas supply hole may be problematic. Therefore, in one embodiment, after the electrostatic chuck is sintered, a fluid (liquid or gas) having a predetermined hydraulic pressure may be supplied into the second gas supply hole to alleviate clogging of the second gas supply hole (S40).

Thereafter, an obtained sintered electrostatic chuck is bonded and fixed onto the base plate using a silicon adhesive or the like (S50).

Figure 6:
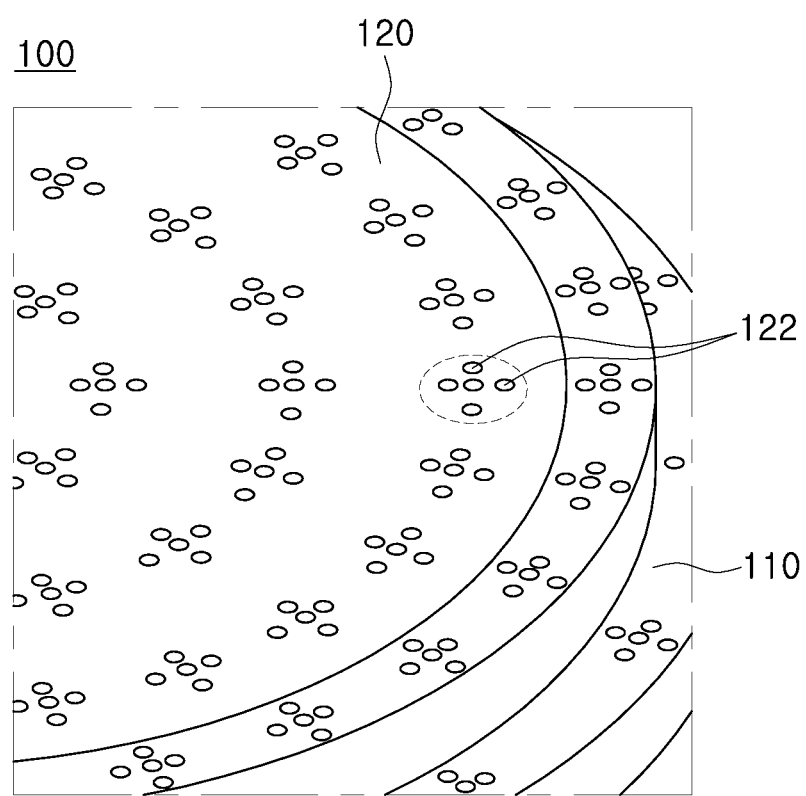
FIG. 6 is a plan view showing an apparatus for supporting a substrate according to a second embodiment of the present invention.
Figure 7:
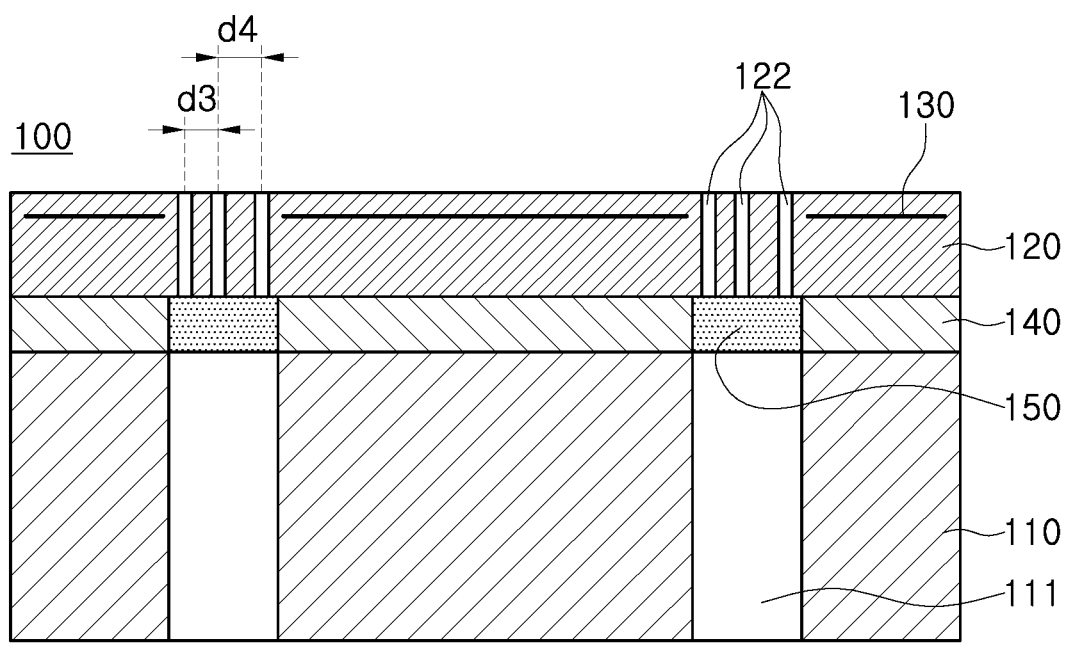
FIG. 7 is a sectional view showing the apparatus for supporting the substrate according to the second embodiment of the present invention.

FIGS. 6 and 7 show an apparatus for supporting a substrate according to a second embodiment of the present invention.

Referring to FIGS. 6 and 7, an apparatus for supporting a substrate according to a second embodiment includes a base plate 110 and an electrostatic chuck 120.

The base plate 110 includes at least one first gas supply hole 111 formed therein. The at least one first gas supply hole 111 is formed to penetrate upper and lower surfaces of the base plate 110.

The electrostatic chuck 120 is disposed on the upper side of the base plate 110. The electrostatic chuck 120 is bonded and fixed onto the base plate 110 by an adhesive layer 140 interposed therebetween. The electrostatic chuck 120 includes at least one second gas supply hole 122 formed therein. The at least one second gas supply hole 122 is formed to penetrate upper and lower surfaces of the electrostatic chuck 120.

The second gas supply holes 122 may be grouped into a plurality of groups of second gas supply holes, such that one group of the plurality of groups of second gas supply holes is disposed within a diameter range of one of the at least one first gas supply hole 111. That is, a first group of the plurality of groups of second gas supply holes 122 may be disposed over one first gas supply hole 111 so as to be in communication therewith.

Herein, as shown in FIG. 7, after sintering of the electrostatic chuck 120, the second gas supply holes 122 included in each group may be arranged at irregular intervals. For example, in one group of the plurality of groups of second gas supply holes, when the interval between one of the second gas supply holes and a neighboring second gas supply hole is d3, and the interval between a remaining one of the second gas supply holes and the neighboring second gas supply hole is d4, the intervals d3 and d4 may be different from each other.

An electrode 130 is provided inside the electrostatic chuck 120 so as to allow a substrate to be adsorbed and held on the chuck by an electrostatic force. The second gas supply holes 122 need to be formed so as not to interfere with the electrode 130. That is, the electrode 130 needs to include a hole having a diameter larger than that of the at least one second gas supply hole 122 at a location corresponding to the at least one second gas supply hole 122.

Those who are ordinarily skilled in the art will appreciate that various alternatives, modifications, and equivalents are possible, without changing the spirit or essential features of the present invention. Therefore, exemplary embodiments of the present invention have been described for illustrative purposes, and should not be construed as being restrictive.

The scope of the present invention is defined by the accompanying claims rather than the description which is presented above. Moreover, the present invention is intended to cover not only the exemplary embodiments, but also various alternatives, modifications, equivalents and other embodiments that may be included within the spirit and scope of the present invention as defined by the appended claims.

What is claimed is:

1. An apparatus for supporting a substrate, the apparatus comprising:
   a base plate including at least one first gas supply hole formed therein so as to allow supply of a temperature control gas; and
   an electrostatic chuck provided on the base plate to support the substrate, and including at least one second gas supply hole formed therein,
   wherein the at least one second gas supply hole penetrates an upper surface of the electrostatic chuck and a lower surface thereof along a straight line extending from the upper surface of the electrostatic chuck to the lower surface thereof so as to be in communication with the at least one first gas supply hole, and
   wherein the at least one second gas supply hole is formed before sintering of the electrostatic chuck.

2. The apparatus of claim 1,
   wherein the at least one second gas supply hole is smaller in diameter than the at least one first gas supply hole.

3. The apparatus of claim 1,
   wherein the second gas supply holes have different diameters.

4. The apparatus of claim 1,
   wherein the second gas supply holes are grouped into a plurality of groups of second gas supply holes, such that one group of the plurality of groups of second gas supply holes is disposed within a diameter range of one of the at least one first gas supply hole.

5. The apparatus of claim 4,
   wherein the second gas supply holes are arranged at irregular intervals.

6. The apparatus of claim 1,
   wherein the base plate and the electrostatic chuck are bonded together by an adhesive layer.

7. The apparatus of claim 1, further comprising:
   a porous body provided inside the at least one first gas supply hole.

8. A method of manufacturing an apparatus for supporting a substrate, the method comprising:
   forming a first gas supply hole in a base plate;
   forming a second gas supply hole in an electrostatic chuck to penetrate upper and lower surfaces of the electrostatic chuck along a straight line extending from the upper surface of the electrostatic chuck to the lower surface thereof;
   sintering the electrostatic chuck so as to reduce a diameter of the second gas supply hole; and
   fixing the sintered electrostatic chuck onto the base plate such that the first and second gas supply holes communicate with each other.

9. The method of claim 8,
   wherein in the forming of the second gas supply hole in the electrostatic chuck, a plurality of second gas supply holes is formed to be disposed within a diameter range of the first gas supply hole.

10. The method of claim 8, further comprising:
    supplying a fluid into the second gas supply hole at a predetermined pressure after the sintering of the electrostatic chuck.

11. An apparatus for supporting a substrate, the apparatus comprising:
    a base plate including at least one first gas supply hole formed therein so as to allow supply of a temperature control gas; and
    an electrostatic chuck provided on the base plate to support the substrate, and including at least one second gas supply hole formed therein so as to be in communication with the at least one first gas supply hole,
    wherein the at least one second gas supply hole is formed before sintering of the electrostatic chuck, and
    wherein a fluid having a predetermined hydraulic pressure is supplied into the at least one second gas supply hole after the sintering of the electrostatic chuck, and
    wherein a diameter of the at least one second gas supply hole is equal to or less than 0.1 mm.

12. The apparatus of claim 1,
    wherein a diameter of the at least one second gas supply hole is equal to or less than 0.1 mm.

13. The method of claim 8,
    wherein a diameter of the second gas supply hole is equal to or less than 0.1 mm.

* * * * *